(12) United States Patent
Chevrier

(10) Patent No.: US 8,674,675 B2
(45) Date of Patent: Mar. 18, 2014

(54) ELECTRONIC DEVICE FOR OPTIMIZING THE OUTPUT POWER OF A SOLAR CELL AND METHOD FOR OPERATING THE ELECTRONIC DEVICE

(75) Inventor: Matthieu Chevrier, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 199 days.

(21) Appl. No.: 13/361,289

(22) Filed: Jan. 30, 2012

(65) Prior Publication Data

US 2012/0212206 A1 Aug. 23, 2012

(30) Foreign Application Priority Data

Feb. 17, 2011 (DE) .......................... 10 2011 011 602

(51) Int. Cl.
G05F 1/00 (2006.01)
H02J 1/00 (2006.01)
H02J 3/00 (2006.01)

(52) U.S. Cl.
USPC ............................................ 323/298; 307/82

(58) Field of Classification Search
USPC .................... 323/298, 906; 307/82
See application file for complete search history.

(56) References Cited

U.S. PATENT DOCUMENTS

| 5,631,535 A | 5/1997 | Van Der Merwe | |
|---|---|---|---|
| 5,682,305 A * | 10/1997 | Kurokami et al. | 363/79 |
| 6,590,793 B1 * | 7/2003 | Nagao et al. | 363/95 |
| 7,193,872 B2 * | 3/2007 | Siri | 363/95 |
| 2005/0254191 A1 * | 11/2005 | Bashaw et al. | 361/62 |
| 2010/0023138 A1 * | 1/2010 | McDonald et al. | 700/59 |
| 2011/0068817 A1 * | 3/2011 | Hashimoto et al. | 324/761.01 |

FOREIGN PATENT DOCUMENTS

| JP | 2002-199604 A | 7/2002 |
|---|---|---|
| JP | 2004-259762 A | 9/2004 |
| JP | 2009-283845 A | 12/2009 |

OTHER PUBLICATIONS

"Solarzelle," https://de.wikipedia.org/w/index.php?title=Solarzelle&oldid=85363387, Feb. 16, 2011.
DE Search Report mailed Jun. 8, 2011.
PCT Search Report mailed Sep. 28, 2012.
"Solar Cells," Physics of Semiconductor Devices, New York, NY, John Wiley & Sons, 1981, pp. 790-838.
DE Office Action mailed May 21, 2012.
"Solarzelle," Wikipedia http://de.wikipedia.org/w/index.php?title=Solarzelle&oldid=85363387, Feb. 16, 2011.

* cited by examiner

*Primary Examiner* — Adolf Berhane
*Assistant Examiner* — Emily P Pham
(74) *Attorney, Agent, or Firm* — William B. Kempler; Wade J. Brady, III; Frederick J. Telecky, Jr.

(57) ABSTRACT

An electronic device for optimizing the output power of a solar cell, the electronic device having: a variable resistor coupled in series between the solar cell and a load, a control unit that is configured to control the variable resistor, a sensor for measuring an output voltage and a sensor for measuring the output current of the solar cell, wherein the control unit is configured to vary the resistance of the series resistor over time such that the first order derivative of the output voltage over time has a constant value, to monitor the second order derivative of the output current over time simultaneously, to detect whether the second order derivative of the output current over time exceeds a predetermined threshold value and to identify the corresponding values of the output voltage and current as a maximum power point (MPP) of the solar cell.

5 Claims, 2 Drawing Sheets

ELECTRONIC DEVICE FOR OPTIMIZING THE OUTPUT POWER OF A SOLAR CELL AND METHOD FOR OPERATING THE ELECTRONIC DEVICE

CROSS-REFERENCE TO RELATED APPLICATIONS

This patent application claims priority from German Patent Application No. 10 2011 011 602.8, filed Feb. 17, 2011, which is incorporated herein by reference in its entirety.

FIELD OF THE INVENTION

The invention generally relates to an electronic device for optimizing the output power of a solar cell. The invention further relates to a method for operating an electronic device for optimizing the output power of a solar cell.

BACKGROUND OF THE INVENTION

The favorable working point for a solar cell is the maximum power point MPP at which the solar cell delivers the maximum output power. FIG. 1 shows the typical current-voltage characteristics (I-V characteristics) of a solar cell according to the prior art. The output power of the solar cell it is given by the product of I and V and its maximum defines the MPP.

A typical method for determining the MPP is to vary a test load that is coupled in series to the real load of the solar cell. The output power is calculated while the test load is varied. Further, the first order derivative of the product of I and V (i.e. the output power of the solar cell) is determined. As might be seen from the output power curve in FIG. 1, its first order derivative changes its slope at MPP. By increasing the current I, when starting at low current values, the corresponding voltage V increases until the output power reaches its maximum. A further increase of the voltage V leads to decreasing values of the current I. In other words, depending on whether the respective I and V values are located left or right from the MPP, the first order derivative has a positive or a negative slope. While a positive slope involves the information that the MPP will be found at higher current values, a negative slope indicates that the MPP is located at lower current values. By adjusting the current and voltage accordingly, the solar cell can be set to its MPP.

However, a plurality of external parameters influences the output power characteristics of a solar cell. Especially, its exposure to light and the working temperature of the cell change the output power curve. Consequently, also the MPP is shifted to different voltage and current values. This dependencies lead to the necessity to adjust the working current and voltage of the solar cell frequently, in order to always operate the solar cell at its MPP. This adjustment is usually performed by a microcontroller unit or a digital signal processor that operates in the aforementioned way. The adjustment must be fast since not only the real load of the solar cell can vary quickly, but also the operating conditions like light exposure and working temperature may be varying. However, the application of microcontroller units or digital signal processors raises the system costs since these components are expensive.

SUMMARY OF THE INVENTION

It is a general object of the invention to provide an alternative electronic device for optimizing the output power of a solar cell. It is further an object to provide an alternative method for operating said electronic device.

The invention provides an electronic device for optimizing the output power of a solar cell. The electronic device comprises a control unit and a variable series resistor being coupled in series between the solar cell and a load. The control unit is configured to control the variable series resistor and, in turn, further comprises a sensor for measuring an output voltage and current of the solar cell. The control unit is configured to vary the resistance of the series resistor over time such that the first order derivative of the output voltage over time has a constant value. Simultaneously, the control unit monitors the second order derivative of the output current over time in order to determine whether it exceeds a predetermined threshold value. The values of the corresponding output voltage and current are identified as the maximum power point of the solar cell.

The electronic device, according to the invention, allows a reliable and cost-effective control and optimization of the operating conditions of a solar cell. Cost intensive components such as microcontrollers etc. may be omitted.

According to an aspect of the invention, the control unit is further configured to identify the maximum power point of the solar cell by means of detection of an extreme value of the second order derivative of the output current over time. Further, the MPP may be located very precisely.

According to a further aspect of the invention, the electronic device is realized as an analog integrated circuit. This allows a very cost effective implementation of the electronic device.

The invention also provides a method for operating an electronic device for optimizing the output power of a solar cell. There is a control unit and a variable series resistor being coupled in series between the solar cell and a load. The control unit is configured to control the variable series resistor and further comprises a sensor for measuring an output voltage and current of the solar cell. The resistance of the series resistor is varied over time such that the first order derivative of the output voltage over time has a constant value. Simultaneously, the second order derivative of the output current over time is monitored and it is determined whether the second order derivative of the output current over time exceeds a predetermined threshold value. The corresponding values of the output voltage and current as a maximum power point of the solar cell is identified.

BRIEF DESCRIPTION OF DRAWINGS

Further aspects of the invention will appear from the appended claims and from the following detailed description given with reference to the appended drawings.

DETAILED DESCRIPTION OF EXAMPLE EMBODIMENTS

Figure 1:
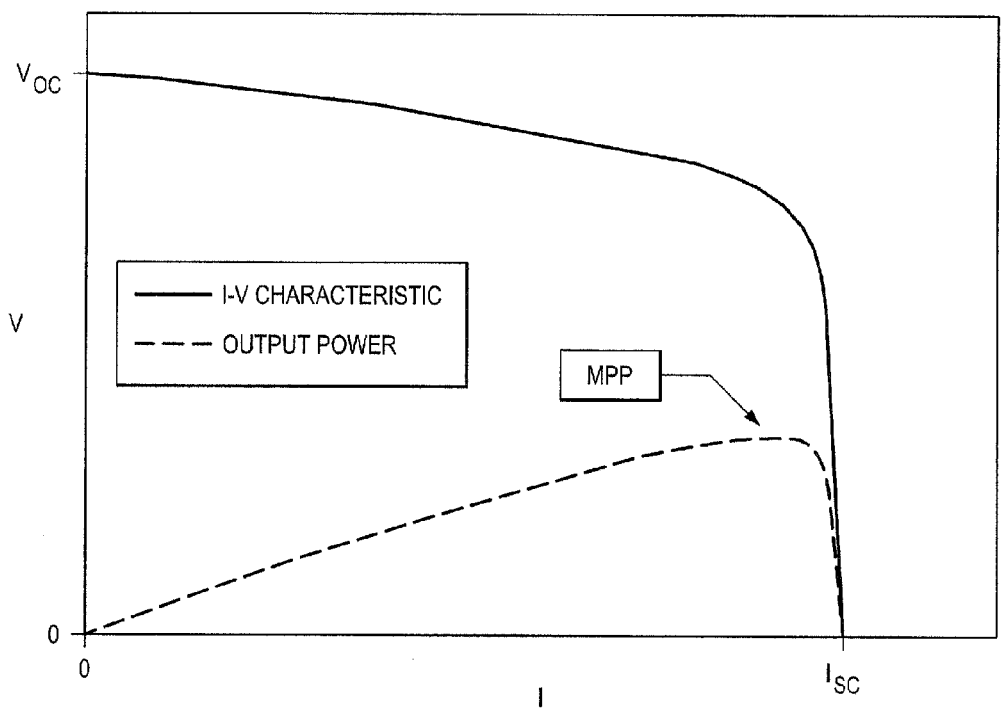
FIG. 1 is a simplified diagram showing the typical current-voltage characteristics and the corresponding output power of a solar cell according to the prior art.

FIG. 1 is a simplified diagram showing the typical current-voltage characteristics (I-V-characteristic) of a solar cell that is exposed to light. Further, the corresponding output power of the solar cell is depicted in FIG. 1. The solar cell delivers its maximum output power at the extremum of the output power curve, which is also referred to as the maximum power point MPP. In order to achieve a maximum efficiency, when operating a solar cell, it is desirable to operate a solar cell at or near by the MPP.

Figure 2:
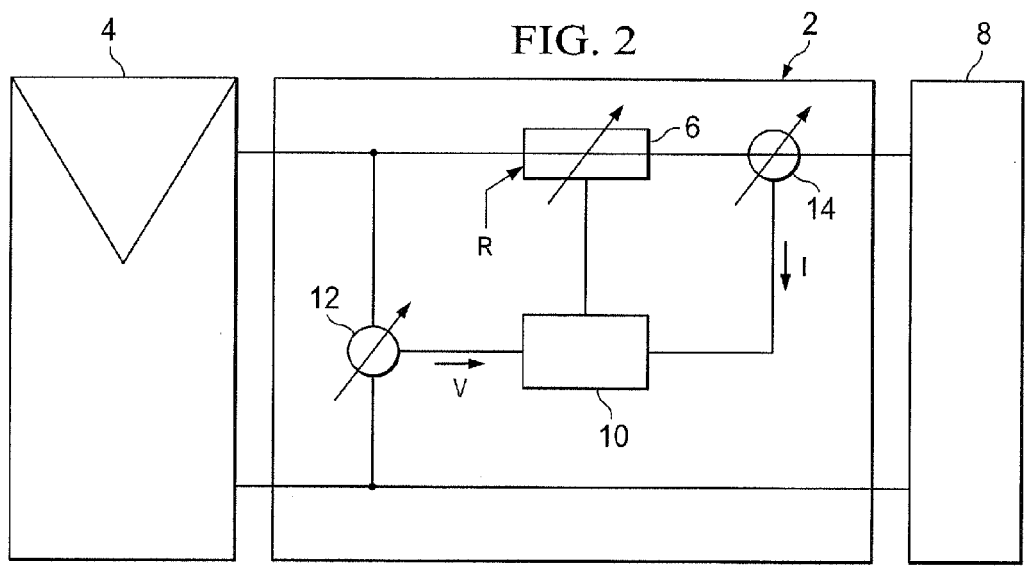
FIG. 2 is a simplified schematic circuit diagram of an electronic device for determining the maximum power point of a solar cell according to an embodiment of the invention.

FIG. 2 is a simplified schematic circuit diagram of an embodiment for an electronic device 2 according the invention. The electronic device 2 comprises a variable series resistor 6, a sensor 12 for measuring the output voltage V and a sensor 14 for measuring the output current I of the solar cell 4.

The variable series resistor R is coupled in series between the solar cell 4 and a load 8. The output voltage V and the output current I are determined by suitable measurement devices 12, 14. The output values V, I are fed to a control unit 10. Preferably, the control unit is an integrated analog circuit that is suitably configured to perform the processing steps that will be described in the following.

The control unit 10 is configured to vary the resistance R of the variable resistor 6 such that the first order derivative of the output voltage V changes continuously over time. In other words, the equation dV/dt=const. is valid. The output voltage V may be changed from a high initial value to a low value and vice versa. The only requirement is that the output voltage V changes continuously over time.

Figure 3:
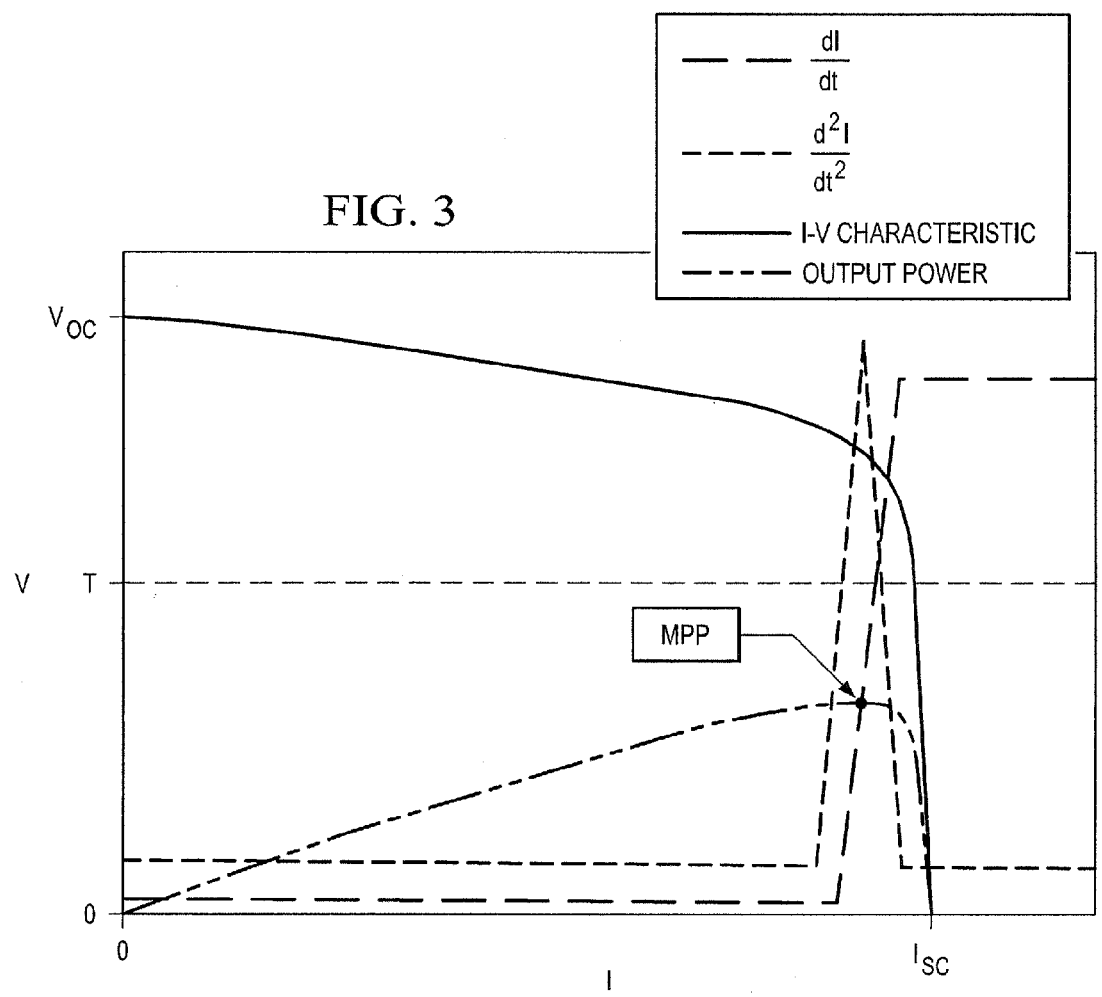
FIG. 3 is a further simplified diagram further showing the first order derivative of an output current over time and the second order derivative of that current over time, according to an embodiment of the invention.

FIG. 3 is a further simplified diagram showing the I-V characteristic as well as the output power of the solar cell 4 that are already known from FIG. 1. In addition and according to an embodiment of the invention, the first and second order derivative of the output current I over time, named dI/dt and d2I/dt2 respectively, are depicted in FIG. 3. The curves are very schematic and do not refer to the given scales. However, this is a minor detail since the gradient of the curves is of interest.

As mentioned before, the equation dV/dt=const. shall be valid. When exemplarily starting at a high voltage V near to the open circuit voltage VOC, a certain change of the voltage V leads to a certain change in the current I. Since the correlation between the voltage V and current I is nearly linear in the regions far away from the MPP, the current I changes more or less proportional to voltage V. When changing the voltage V continuously in a certain time interval, which means dV/dt=const. is valid, the current I will also change continuously in time, which means that the first order derivative of the current over time dI/dt is constant. This behavior of the dI/dt-curve can bee seen in regions far away from the MPP. When starting at a high voltage value near to the open circuit voltage VOC, the current I initially changes very slightly with the changing voltage V. When speaking in changes over time and assuming that the change of the voltage V over time is constant, the corresponding change of the current I over time is low, as it is visible in the left part of the graph of dI/dt.

In the region of the MPP, the change of the current I with the voltage V changes drastically since the slope of the I-V curve changes drastically. A very small change in the voltage V will lead to a huge change in the current I. Again, the change of the voltage V over time shall be constant. This means that the corresponding change of the current I over time changes from a moderate value to a significantly higher value.

Even more significant is the change of the current over time when looking at the second order derivative d2I/dt2. It clearly shows a maximum when the first order derivative steps up from the lower to the higher value. The curve of d2I/dt2 is depicted as a dashed line in FIG. 3.

It has been realized that the extremum of the second order derivative of the current over time (the maximum in FIG. 3) corresponds to the MPP. The corresponding current corresponds to the MPP.

This opens up the possibility to adjust the solar cell 4 to the MPP by watching the second order derivative of the current over time d2I/dt2. The voltage V is changed continuously over time and at the same time d2I/dt2 is monitored.

As a first approach, it shall be assumed that the MPP has been found when the value of d2I/dt2 exceeds a certain threshold value T. A further alternative could be to detect the maximum itself—overrun it and step back a certain offset value in order to exactly set the solar cell 4 to the MPP. By detecting the extremum itself, the MPP may be determined very precisely.

Although the invention has been described in detail, it should be understood that various changes, substitutions and alterations can be made thereto without departing from the spirit and scope of the invention as defined by the appended claims.

The invention claimed is:

1. An electronic device for optimizing the output power of a solar cell, the electronic device comprising:
    a variable series resistor being coupled in series between the solar cell and a load;
    a control unit that is configured to control the variable series resistor;
    a sensor for measuring an output voltage;
    and a sensor for measuring the output current of the solar cell; and
    the control unit being configured to vary the resistance of the variable series resistor over time such that the first order derivative of the output voltage over time has a constant value, to monitor the second order derivative of the output current over time simultaneously, to detect whether the second order derivative of the output current over time exceeds a predetermined threshold value and to identify the corresponding values of the output voltage and the output current as a maximum power point (MPP) of the solar cell.

2. The electronic device according to claim 1, wherein the control unit is further configured to identify the maximum power point (MPP) of the solar cell by detecting an extreme value of the second order derivative of the output current over time.

3. The electronic device according to claim 1, wherein the electronic device is a discrete analog integrated circuit.

4. The electronic device according to claim 2, wherein the electronic device is a discrete analog integrated circuit.

5. A method for operating an electronic device for optimizing the output power of a solar cell, the electronic device comprising:
    a variable series resistor being coupled in series between the solar cell and a load, a control unit that is configured to control the variable series resistor;
    a sensor for measuring an output voltage and a sensor for current of the solar cell, the method comprising:
        varying the resistance of the variable series resistor over time such that the first order derivative of the output voltage over time has a constant value;
        simultaneously monitoring the second order derivative of the output current over time; and
        determining whether the second order derivative of the output current over time exceeds a predetermined threshold value and identifying the corresponding values of the output voltage and the output current as a maximum power point (MPP) of the solar cell.

* * * * *

UNITED STATES PATENT AND TRADEMARK OFFICE
CERTIFICATE OF CORRECTION

PATENT NO. : 8,674,675 B2
APPLICATION NO. : 13/361289
DATED : March 18, 2014
INVENTOR(S) : Matthieu Chevrier It is certified that error appears in the above-identified patent and that said Letters Patent is hereby corrected as shown below:

On the Title Page, item (30) foreign priority should read: GERMANY 10 2011 011 602.8, filed 2/17/2011

Signed and Sealed this
Thirteenth Day of May, 2014

Michelle K. Lee
*Deputy Director of the United States Patent and Trademark Office*